(12) United States Patent
Shoyama

(10) Patent No.: US 10,475,841 B2
(45) Date of Patent: Nov. 12, 2019

(54) METHOD OF MANUFACTURING SOLID-STATE IMAGE SENSOR, SOLID-STATE IMAGE SENSOR, AND CAMERA

(71) Applicant: CANON KABUSHIKI KAISHA, Tokyo (JP)

(72) Inventor: Toshihiro Shoyama, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/721,150

(22) Filed: May 26, 2015

(65) Prior Publication Data

US 2015/0349013 A1 Dec. 3, 2015

(30) Foreign Application Priority Data

Jun. 2, 2014 (JP) .................................. 2014-114367

(51) Int. Cl.
*H04N 3/14* (2006.01)
*H04N 5/335* (2011.01)
*H01L 27/146* (2006.01)

(52) U.S. Cl.
CPC .. *H01L 27/14636* (2013.01); *H01L 27/14612* (2013.01); *H01L 27/14643* (2013.01);
(Continued)

(58) Field of Classification Search
CPC ......... H01L 27/14689; H01L 27/14687; H01L 27/146; H04N 5/374
See application file for complete search history.

(56) References Cited

U.S. PATENT DOCUMENTS 6,097,052 A * 8/2000 Tanaka ............. H01L 21/76802
257/306
6,838,298 B2  1/2005 Lee
(Continued)

FOREIGN PATENT DOCUMENTS

JP    2003-282856 A    10/2003
JP    2005-340258 A    12/2005
(Continued)

OTHER PUBLICATIONS

Notification of Reasons for Refusal in Japanese Application No. 2014-114367 (dated Dec. 11, 2017).
(Continued)

*Primary Examiner* — Lin Ye
*Assistant Examiner* — Selam T Gebriel
(74) *Attorney, Agent, or Firm* — Venable LLP

(57) ABSTRACT

A method of manufacturing a solid-state image sensor comprising a pixel part including a photoelectric conversion element and a MOS transistor, comprising steps of forming a first insulating film made of a nitrogen-containing silicon compound on the photoelectric conversion element and the MOS transistor, forming an opening in at least a portion of the first insulating film, which is positioned above a channel of the MOS transistor, forming a second insulating film on the first insulating film, forming a contact hole extending through the second insulating film and the first insulating film, and forming, in the contact hole, a contact plug to be connected to the MOS transistor.

21 Claims, 8 Drawing Sheets

(52) U.S. Cl.
CPC .. *H01L 27/14685* (2013.01); *H01L 27/14689* (2013.01); *H01L 27/14698* (2013.01); *H01L 27/1463* (2013.01)

(56) References Cited

U.S. PATENT DOCUMENTS

| | | |
|---|---|---|
| 7,592,655 B2 | 9/2009 | Ohkawa et al. |
| 7,920,192 B2 | 4/2011 | Watanabe et al. |
| 8,120,684 B2 | 2/2012 | Arakawa |
| 8,411,187 B2 | 4/2013 | Watanabe et al. |
| 8,553,125 B2 | 10/2013 | Akiyama et al. |
| 8,691,637 B2 | 4/2014 | Arakawa |
| 8,982,254 B2 | 3/2015 | Shoyama |
| 8,987,852 B2 | 3/2015 | Okabe et al. |
| 2009/0078974 A1 | 3/2009 | Nagai et al. |
| 2009/0225209 A1* | 9/2009 | Arakawa ........... H01L 27/14609 348/306 |
| 2010/0330723 A1* | 12/2010 | Okabe ............... H01L 21/28518 438/59 |
| 2011/0003426 A1 | 1/2011 | Watanabe et al. |
| 2012/0199893 A1* | 8/2012 | Okabe ............... H01L 27/14641 257/291 |
| 2013/0088626 A1* | 4/2013 | Shoyama .......... H01L 27/14627 348/300 |
| 2013/0089963 A1 | 4/2013 | Mishima et al. |
| 2014/0063308 A1* | 3/2014 | Saito ...................... H04N 5/363 348/308 |
| 2014/0151754 A1 | 6/2014 | Arakawa |
| 2015/0349013 A1 | 12/2015 | Shoyama |
| 2016/0254308 A1 | 9/2016 | Arakawa |

FOREIGN PATENT DOCUMENTS

| | | |
|---|---|---|
| JP | 2006-216615 A | 8/2006 |
| JP | 2006-261355 A | 9/2006 |
| JP | 2008-041726 A | 2/2008 |
| JP | 2009-059824 A | 3/2009 |
| JP | 2009-212339 A | 9/2009 |
| JP | 2012-015315 A | 1/2012 |
| JP | 2012-182426 A | 9/2012 |
| JP | 2013-084693 A | 5/2013 |
| JP | 2013-084740 A | 5/2013 |
| JP | 2013-089652 A | 5/2013 |
| JP | 2014-049671 A | 3/2014 |
| JP | 2015-228464 A | 12/2015 |
| KR | 10-2011-0078878 A | 7/2011 |

OTHER PUBLICATIONS

Notification of Reasons for Refusal in Japanese Application No. 2018-078629 (dated Mar. 29, 2019).

* cited by examiner

METHOD OF MANUFACTURING SOLID-STATE IMAGE SENSOR, SOLID-STATE IMAGE SENSOR, AND CAMERA

BACKGROUND OF THE INVENTION

Field of the Invention

The present invention relates to a method of manufacturing a solid-state image sensor, a solid-state image sensor, and a camera.

Description of the Related Art

For protection against plasma damage during the manufacturing process, a solid-state image sensor having a structure in which a silicon nitride film is formed on a photoelectric converter including a photodiode has been proposed. Japanese Patent Laid-Open No. 2008-41726 describes a method of manufacturing a solid-state image sensor having a structure in which a silicon nitride film as the material of side spacers of a MOS transistor is not etched back but left behind on a photoelectric converter. More specifically, after a silicon nitride film is deposited, the silicon nitride film is so processed as to form sidewalls of a MOS transistor by etch back in a peripheral circuit region, and a photoelectric conversion region is protected by a mask. This method can reduce plasma damage to the photoelectric converter.

SUMMARY OF THE INVENTION

In this method described in Japanese Patent Laid-Open No. 2008-41726, however, a structure in which almost the entire surfaces of transistors in the photoelectric converter and a pixel region are covered with the silicon nitride film is obtained. Since the silicon nitride film hardly transmits hydrogen, the silicon nitride film blocks hydrogen diffusion during hydrogen sintering. As a consequence, the hydrogen termination of a dangling bond of a gate insulating film becomes insufficient, and this makes it difficult to obtain a low-noise, solid-state image sensor.

According to one aspect of the present invention, therefore, there is provided a solid-state image sensor having a structure capable of effectively performing the hydrogen termination of a dangling bond of a gate insulating film of a transistor.

According to some embodiments, a method of manufacturing a solid-state image sensor comprising a pixel part including a photoelectric conversion element and a MOS transistor is provided. The method comprising steps of forming a first insulating film made of a nitrogen-containing silicon compound on the photoelectric conversion element and the MOS transistor, forming an opening in at least a portion of the first insulating film, which is positioned above a channel of the MOS transistor, forming a second insulating film on the first insulating film, forming a contact hole extending through the second insulating film and the first insulating film, and forming, in the contact hole, a contact plug to be connected to the MOS transistor.

Further features of the present invention will become apparent from the following description of exemplary embodiments (with reference to the attached drawings).

DESCRIPTION OF THE EMBODIMENTS

Practical embodiments of the present invention will be explained below, but the present invention is not limited to the following embodiments. For example, in the following embodiments, a so-called, front-illuminated, solid-state image sensor will be explained as a solid-state image sensor. However, the present invention is also applicable to a back-illuminated, solid-state image sensor.

(First Embodiment)

A solid-state image sensor and a method of manufacturing the same according to the first embodiment of the invention will be explained with referenced to FIGS. 1A to 5C.

Figure 1A:
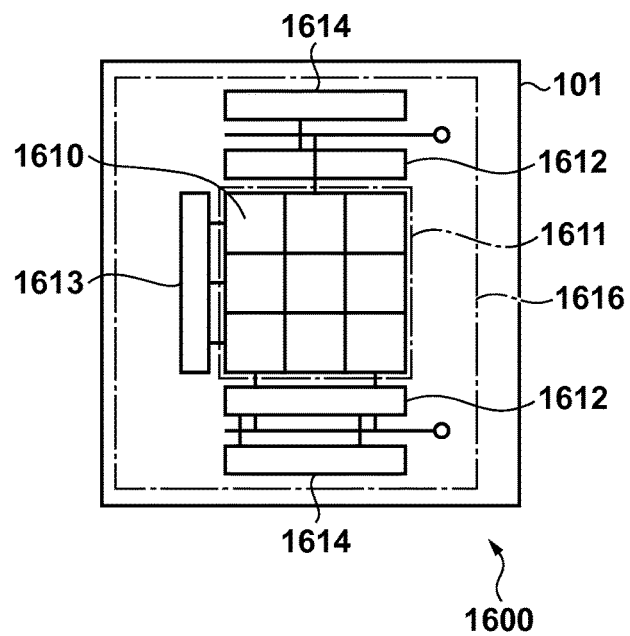
FIGS. 1A to 1D are views showing examples of an equivalent circuit and planar layout of a solid-state image sensor according to embodiments of the present invention.

FIG. 1A shows an example of the planar layout view of the solid-state image sensor. A solid-state image sensor 1600 includes a pixel part 1611 in which photoelectric converters 1610 are arranged, and a peripheral circuit part 1616 in which peripheral circuits 1612 to 1614 are arranged. The pixel part 1611 and peripheral circuit part 1616 are formed on a single semiconductor substrate 101.

As shown in FIG. 1A, the peripheral circuit part 1616 includes a signal processor 1612, vertical shift register 1613, and horizontal shift register 1614. The signal processor 1612 is a circuit which amplifies signals read out from the photoelectric converters 1610, and removes pixel noise by CDS processing. The signal processor 1612 may also be a circuit which converts a plurality of signals read out in parallel row by row from the two-dimensionally arranged photoelectric converters 1610 into a serial signal to be output outside. The vertical shift register 1613 is a driving circuit which selects and drives the photoelectric converters 1610 in the pixel part 1611 row by row. The horizontal shift register 1614 is a circuit which drives a MOS transistor of the signal processor 1612, and transfers a signal outside from the signal processor 1612. When performing A/D conversion in the solid-state image sensor 1600, an A/D converter may also be included in the peripheral circuits.

Figure 1B:
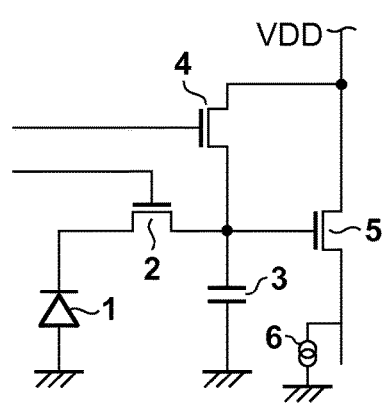

FIG. 1B shows an example of an equivalent circuit diagram of the photoelectric converter 1610 in the solid-state image sensor of the present invention. The photoelectric converter 1610 includes at least a photoelectric conversion element 1, transfer MOS transistor 2, reset MOS transistor 4, and amplification MOS transistor 5. In this example, a pixel is selected by a voltage to be applied to the drain of the reset MOS transistor 4. The photoelectric conversion element 1 is, for example, a photodiode, and converts incident light into electric charge by photoelectric conversion. In this example, the anode is grounded. The cathode of the photodiode 1 is connected to a floating diffusion (floating diffusion region: FD) 3 via the transfer MOS transistor 2. The transfer MOS transistor 2 functions as a transfer unit which transfers the electric charge of the photoelectric conversion element, thereby giving the gate potential to the amplification MOS transistor 5 as an amplifier.

The amplification MOS transistor 5 generates a signal based on a potential change caused by the electric charge generated by the photoelectric conversion element 1, and outputs the signal to a signal line. A target of the potential change need only be a node floated when the electric charge is transferred from the photoelectric conversion element 1, and the floating diffusion 3 is used. The FD 3 is connected to the gate of the amplification MOS transistor 5, and a signal based on the potential change of the FD 3 is output to the signal line. Since the electric charge is output after being amplified by a source-follower operation, the MOS transistor 5 is an amplification element. A power supply (VDD), the amplification MOS transistor 5, the signal line, and a constant current source 6 form a source-follower circuit. In this example, the selecting operation is performed by the drain voltage of the reset MOS transistor 4. However, selection may also be performed by forming a selection MOS transistor.

FIGS. 2A to 6 are schematic sectional views showing the manufacturing steps of the solid-state image sensor according to this embodiment. In this embodiment, an explanation will be made by taking, as examples, a photodiode 301 corresponding to the photoelectric conversion element 1, a first MOS transistor 302 corresponding to the transfer MOS transistor 2, a second MOS transistor 303 corresponding to the reset MOS transistor 4, and a third MOS transistor 304 corresponding to the amplification (source-follower) MOS transistor 5, arranged in the photoelectric converter 1610.

The solid-state image sensor according to the first embodiment can be so configured as to include the pixel part 1611 and peripheral circuit part 1616. The pixel part 1611 typically includes a plurality of pixels, and each pixel includes one photoelectric conversion element. The peripheral circuit part 1616 is a region except for the pixel part 1611, and can include the above-described vertical scanning circuit (row selecting circuit) and the like. FIGS. 2A to 6 illustrate the pixel part 1611 including two photoelectric conversion elements and three transistors, and the peripheral circuit part 1616 including one transistor 305. However, this arrangement is simplified for the sake of descriptive simplicity. In practice, therefore, the pixel part 1611 can include more photoelectric conversion elements and transistors, and the peripheral circuit part 1616 can include more transistors.

The method of manufacturing the solid-state image sensor according to this embodiment will be explained below. First, in a step shown in FIG. 2A, the semiconductor substrate 101 on which elements such as transistors and photoelectric conversion elements are formed is prepared. The semiconductor substrate 101 is typically a silicon substrate, and has a major surface 102. The semiconductor substrate 101 includes n-type semiconductor regions 202 and 203 for forming photoelectric conversion elements (photodiodes), the transistors 302, 303, and 304 of the pixel part 1611, and the transistor 305 of the peripheral circuit part 1616. The n-type semiconductor regions 202 and 203 function as charge storage regions which store electric charge (in this example, electrons). Gate electrodes 206 and 207 of the transfer MOS transistor respectively correspond to the n-type semiconductor regions 202 and 203, and have a function of transferring the electric charge of the n-type semiconductor regions 202 and 203. An n-type semiconductor region 314 is formed in a deeper position from the substrate surface of the semiconductor substrate 101. The n-type semiconductor region 314 is formed at an impurity concentration lower than that of the n-type semiconductor regions 202 and 203 as the charge storage regions. The region 314 may also be formed as a p-type semiconductor region. A p-type semiconductor region 315 is formed in a position deeper than the n-type semiconductor region 314.

Figure 2A:
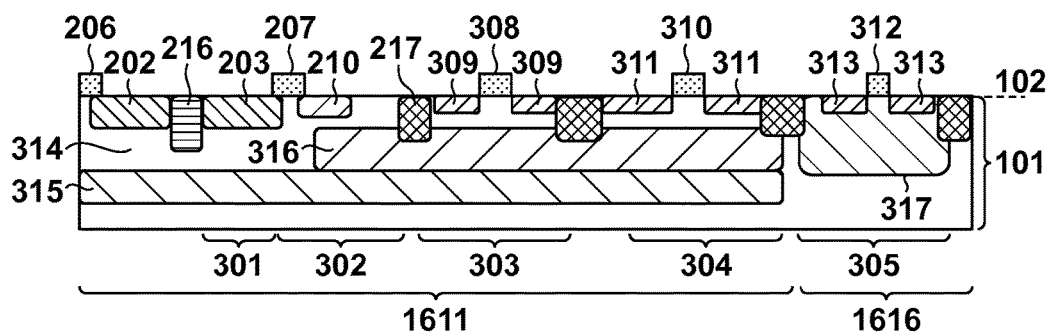
FIGS. 2A to 2C are views showing an example of a method of manufacturing a solid-state image sensor according to the first embodiment of the present invention.

In the structure shown in FIG. 2A, at least the n-type semiconductor region 202, n-type semiconductor region 314, and p-type semiconductor region 315 form one photoelectric conversion element. Similarly, at least the n-type semiconductor region 203, n-type semiconductor region 314, and p-type semiconductor region 315 form one photoelectric conversion element 301. Note that the n-type semiconductor regions 202 and 203 are isolated from each other by an isolation portion 216.

The reset MOS transistor 303 of the pixel part 1611 includes n-type source/drain regions 309 and a gate electrode 308. The amplification MOS transistor 304 of the pixel part 1611 includes n-type source/drain regions 311 and gate electrode 310. A p-type semiconductor region 316 is formed in a position deeper from the substrate surface of the semiconductor substrate 101 than the source/drain regions 309 of the reset MOS transistor 303, the source/drain regions 311 of the amplification MOS transistor 304, and the floating diffusion 210.

In the peripheral circuit part 1616, a plurality of NMOS transistors and a plurality of PMOS transistors forming a CMOS circuit are arranged. For the sake of simplicity, however, FIGS. 2A to 6 show only the NMOS transistors. The transistor 305 of the peripheral circuit part 1616 includes n-type source/drain regions 313 arranged in a p-type semiconductor region 317, and a gate electrode 312 formed on the major surface 102 of the semiconductor substrate 101 between the source/drain regions 313. Note that for the sake of simplicity, FIGS. 2A to 6 do not show a gate insulating film which is formed on the major surface 102 of the semiconductor substrate 101, and on which the gate electrode 312 is formed. This gate insulating film can be a silicon oxide film formed by thermally oxidizing the semiconductor substrate 101. The transistors 303, 304, 305, and the like are isolated from each other by element isolation portions 217.

Figure 2B:
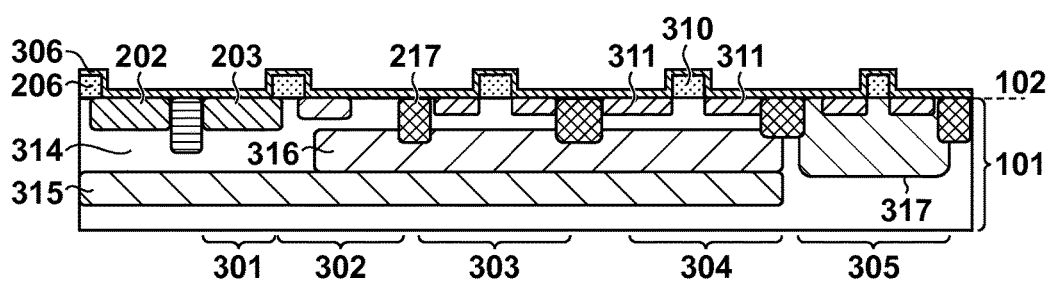

Then, an insulating film 306 is formed by stacking a plurality of layers on the major surface 102 of the semiconductor substrate 101 in the regions of both the pixel part 1611 and peripheral circuit part 1616. FIG. 2B shows an example of the state in which the insulating film 306 is formed. More specifically, a silicon nitride film can be formed as the insulating film 306 on the major surface 102 of the semiconductor substrate 101. As this silicon nitride film, it is desirable to use a silicon nitride film formed by LP-CVD (Low-Pressure Chemical Vapor Deposition). LP-CVD is adopted instead of plasma CVD for the following reason. First, plasma CVD can form a silicon nitride film as a film containing a large amount of hydrogen, so hydrogen diffusion is possible in hydrogen sintering. However, plasma damage is inflicted to the Si crystal of the photoelectric conversion element during deposition, and this may increase a dark current of the solid-state image sensor. Accordingly, not plasma CVD but LP-CVD is adopted in this stage.

Figure 2C:
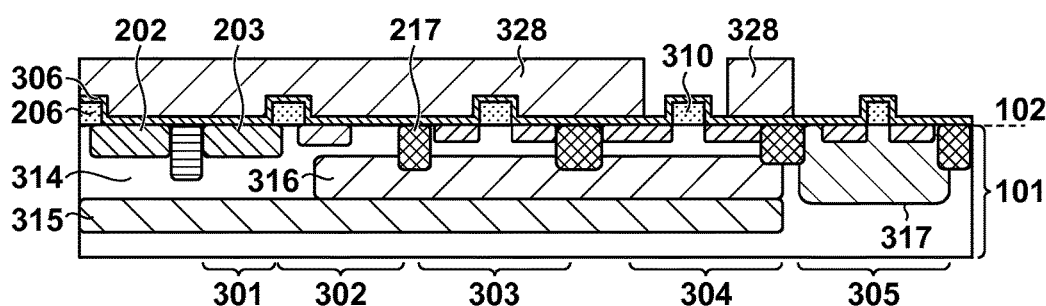

Note that the insulating film 306 may also be formed by a nitrogen-containing silicon compound such as a silicon oxynitride film (SiON) or silicon carbonitride film (SiCN), instead of a silicon nitride film (SiN). The silicon nitride film, silicon oxynitride film, and silicon carbonitride film hardly transmit hydrogen, and hence can block hydrogen diffusion in hydrogen sintering. Note that a silicon oxide film may also be formed as a buffering film between the major surface 102 and insulating film 306. Subsequently, in order to perform patterning, a photoresist 328 is so formed as to expose a region including at least a portion of the gate electrode 310 of the third transistor 304, and the peripheral circuit part 1616. The region including at least a portion of the gate electrode 310 includes a channel formation region below the gate electrode 310 of the third transistor 304. FIG. 2C shows an example of the state in which the photoresist 328 is formed.

Figure 3A:
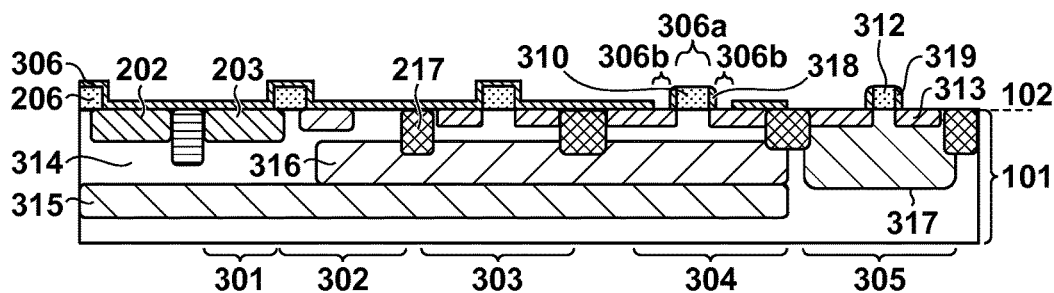
FIGS. 3A to 3C are views showing the example of the method of manufacturing the solid-state image sensor according to the first embodiment of the present invention.

As shown in FIG. 3A, etching is performed by patterning using the photoresist 328, thereby forming side spacers 318 and 319 on the sidewalls of the gate electrodes 310 and 312, respectively. In this step, a region of the insulating film 306, which is not covered with the side spacers, can be removed. Consequently, the insulating film 306 formed on the gate electrode 310 is removed, and an opening 306a is formed in a portion positioned on the channel. Also, openings 306b are formed in portions of the source/drain regions 311 near the side spacers 318, or formed adjacent to the side spacers 318. Note that in the peripheral circuit part 1616, ion implantation of, for example, phosphorus or arsenic is performed by using the side spacers 319, thereby implanting many ions in a region where no side spacer exists compared to a region where the side spacers exist. Consequently, the source/drain regions 313 can be formed as an LDD (Lightly Doped Drain) structure.

In the pixel part 1611, the insulating film 306 remaining in the portion including a portion of the gate electrode 310 of the transistor 304 and excluding the opening 306a can be used as an etching stopper when forming a contact hole on a MOS transistor or the like, and can also be used as an antireflection film of the photoelectric conversion element. The insulating film 306 also remains in the source/drain regions of the transistor 304 and in a portion of the gate electrode 310, and is used as an etching stopper when forming a contact hole.

Figure 3B:
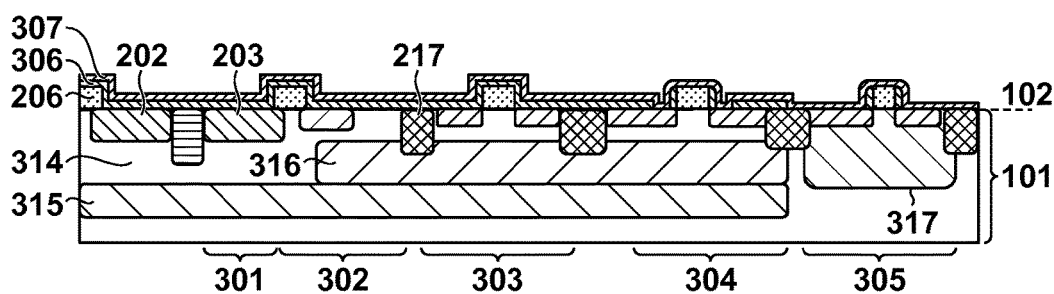

On the source/drain regions 313 and gate electrode 312, a silicide layer of a refractory metal such as cobalt silicide can be formed by depositing a refractory metal such as cobalt and annealing the metal. This silicide layer can selectively be formed on only the transistor of the peripheral circuit part 1616, in order to reduce the electrical resistances of the source/drain regions 313 and gate electrode 312. To selectively form the silicide layer, a region where no silicide layer is to be formed is masked through steps shown in FIGS. 3B and 3C. First, as shown in FIG. 3B, a silicon oxide film 307 is formed on the major surface 102. The silicon oxide film 307 is so formed as to cover the opening 306a of the insulating film 306 formed on the gate electrode 310 formed in FIG. 3A, and come in contact with the gate electrode 310. Also, the silicon oxide film 307 is so formed as to cover the side surfaces of the openings 306b of the insulating film 306 near the side spacers exposed buy patterning, and filled in the openings 306b. In contrast to the silicon nitride film, the silicon oxide film readily transmits hydrogen. In hydrogen sintering, therefore, it is possible to secure a hydrogen path extending through the silicon oxide film 307 and opening 306a.

Figure 3C:
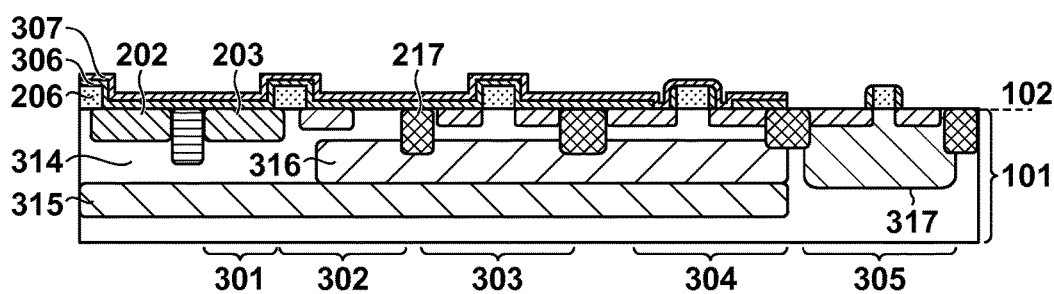
Figure 4A:
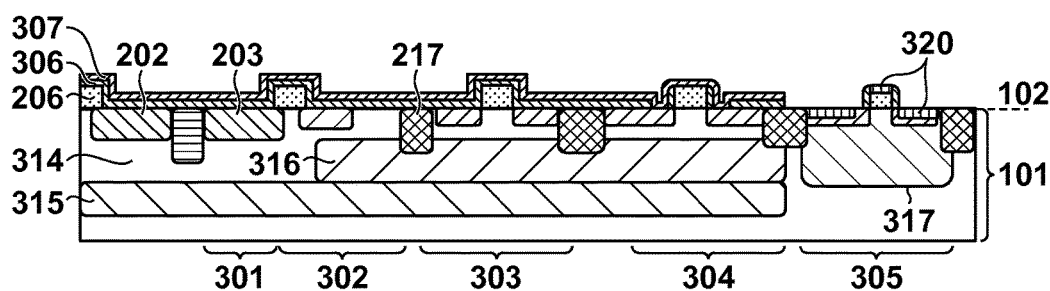
FIGS. 4A to 4C are views showing the example of the method of manufacturing the solid-state image sensor according to the first embodiment of the present invention.

Then, the silicon oxide film 307 is removed by etching from only the peripheral circuit part 1616 where the silicide layer is to be formed. As shown in FIG. 3C, therefore, the gate electrode 312 and source/drain regions 313 are exposed. Subsequently, a refractory metal such as cobalt is deposited and annealed. As a consequence, as shown in FIG. 4A, a silicide layer 320 can be formed by self-alignment in only the portion where Si is exposed. Note that the silicide layer 320 may also be formed in only the source/drain regions 313 or gate electrode 312.

Figure 4B:
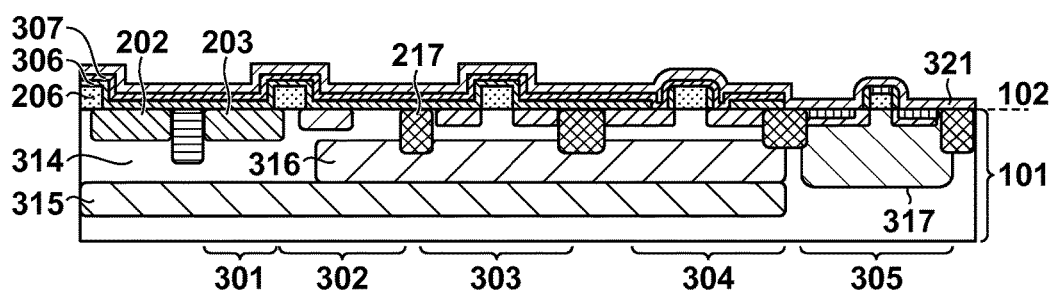

Then, as shown in FIG. 4B, an insulating film 321 can be formed in the regions of both the pixel part 1611 and peripheral circuit part 1616. The insulating film 321 can be formed as a silicon nitride film. Note that before the silicon nitride film is formed, a silicon oxide film may also be formed in both the pixel part 1611 and peripheral circuit part 1616, in order to improve the adhesion by stress relaxation of the film.

Figure 4C:
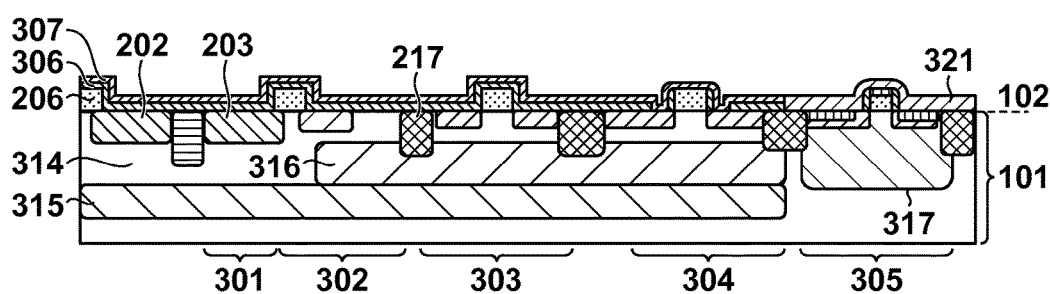

After that, the insulating film 321 formed in the pixel part 1611 and peripheral circuit part 1616 is patterned. In this step, if the silicon oxide film is formed together with the silicon nitride film, the silicon oxide film may also be patterned into the same shape as that of the silicon nitride film. Consequently, as shown in FIG. 4C, the insulating film 321 is removed by etching from the region of the pixel part 1611. In the peripheral circuit part 1616, the insulating film 321 is not etched but left behind. As will be described later in, for example, the second embodiment, the silicon nitride film as the insulating film 321 may also be formed so as to remain in a portion of the photoelectric conversion element in accordance with the purpose.

Figure 5A:
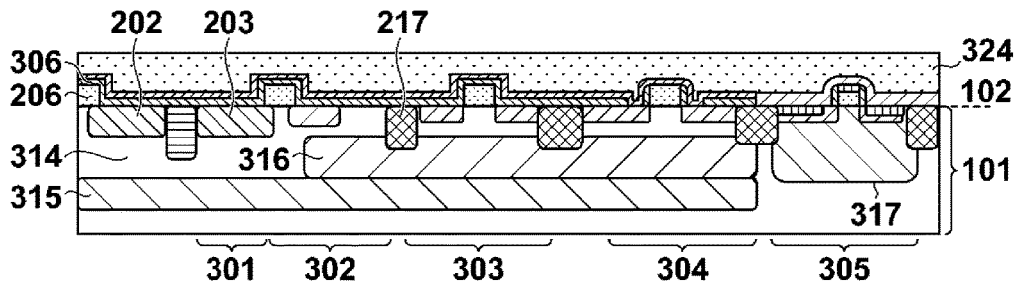
FIGS. 5A to 5C are views showing the example of the method of manufacturing the solid-state image sensor according to the first embodiment of the present invention.
Figure 5B:
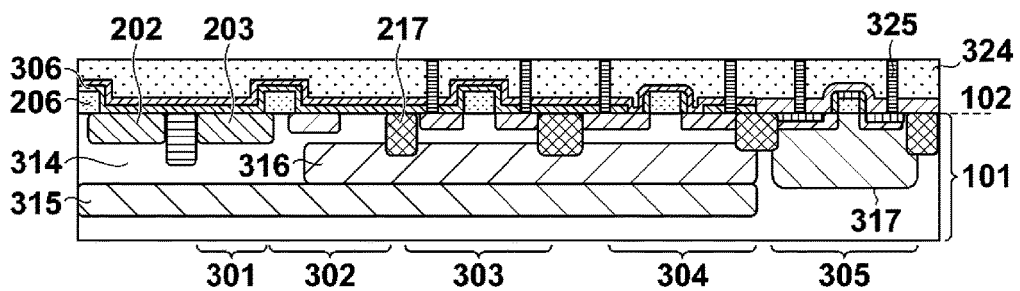
Figure 5C:
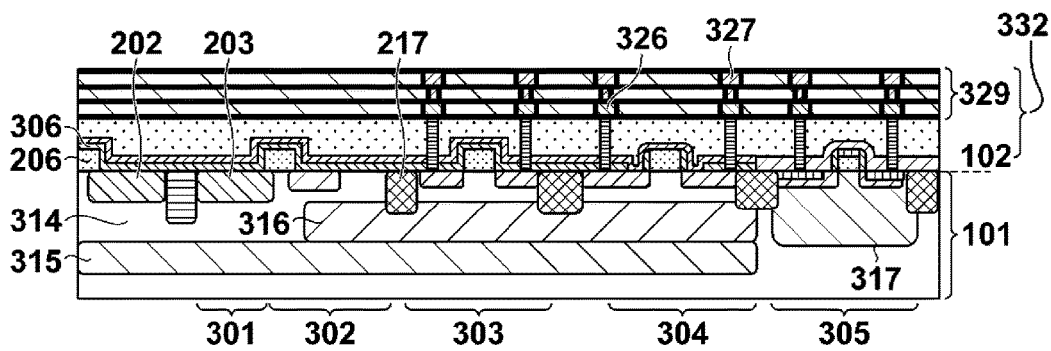

In steps shown in FIGS. 5A to 5C, an interconnection layer 332 including an interlayer dielectric film 324, contact plugs 325, a first interconnection layer 326, a second interconnection layer 327 including a via plug, and a plurality of interlayer dielectric films 329 can be formed. First, as shown in FIG. 5A, the interlayer dielectric film 324 is formed on the silicon oxide film 307 and insulating film 321 by, for example, CVD. Then, contact holes extending through the interlayer dielectric film 324, silicon oxide film 307, and insulating film 306 are formed by a photolithography step and a subsequent etching step using reactive ion etching. After that, an intermetallic compound mainly containing, for example, tungsten is grown by CVD so as to fill the formed contact holes and cover the interlayer dielectric film 324. Subsequently, the formed metal film is polished by CMP and removed from a portion except for the contact holes, thereby forming a contact plug 325 on each MOS transistor as shown in FIG. 5B. After that, the first interconnection layer 326 and second interconnection layer 327 are formed on the interlayer dielectric film 324, thereby obtaining a state shown in FIG. 5C.

Note that the interlayer dielectric film 324 and the plurality of interlayer dielectric films 329 can be formed by alternately stacking a silicon oxide film and silicon nitride film. The first interconnection layer 326 and second interconnection layer 327 can be formed by, for example, a damascene method using a material mainly containing copper, but may also be formed by another material such as aluminum.

Figure 6:
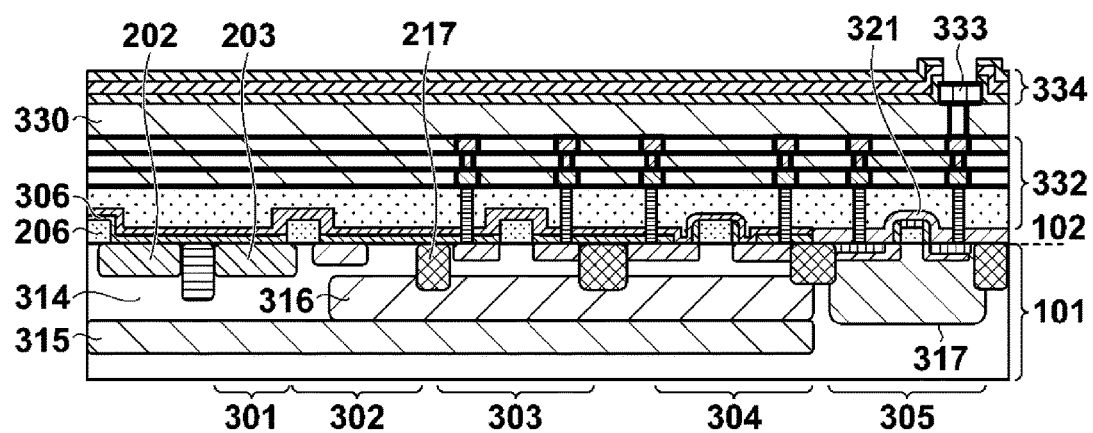
FIG. 6 is a view showing the example of the method of manufacturing the solid-state image sensor according to the first embodiment of the present invention.

Then, an insulating film 334 is formed. FIG. 6 is a view showing an example of the state in which the insulating film 334 is formed. The insulating film 334 is a silicon compound containing nitrogen, and can be formed by one of a silicon nitride film, silicon oxide film, and silicon oxynitride film, or a multilayered film of these films. The insulating film 334 of this example is a multilayered film in which a silicon oxynitride layer, silicon nitride layer, and silicon oxynitride layer are stacked in this order. The lower and upper silicon oxynitride layers can function as antireflection layers. Also, the silicon nitride film is desirably a film formed by plasma CVD and containing a large amount of hydrogen. This is so because the silicon nitride film can function as a hydrogen supply source in later hydrogen sintering. After that, the insulating film 334 is formed by removing it from regions corresponding to pads such as an input pad and output pad.

Subsequently, a sintering process is performed in a hydrogen ambient. In this embodiment, the opening 306a is formed in the insulating film 306 on the upper surface of the gate electrode 310 of the third MOS transistor 304 corresponding to the amplification MOS transistor 5. Accordingly, hydrogen is introduced to the polysilicon gate electrode 310 through the opening 306a, and this enables hydrogen termination of the dangling bond of the gate insulating film. Note that the insulating film 334 is so formed as to contain a large amount of hydrogen, hydrogen diffusion occurs from the silicon nitride films such as the insulating film 334, so a sintering process using 100% hydrogen gas is not always necessary. That is, the effect of the present invention is not lost even by annealing in a gas ambient formed by adding a few % of hydrogen to nitrogen, or in a nitrogen gas ambient. After that, a planarization layer (not shown) made of a resin, a color filter layer (not shown) including color filters corresponding to a plurality of colors, and a microlens layer (not shown) including microlenses are formed in this order.

Figure 1C:
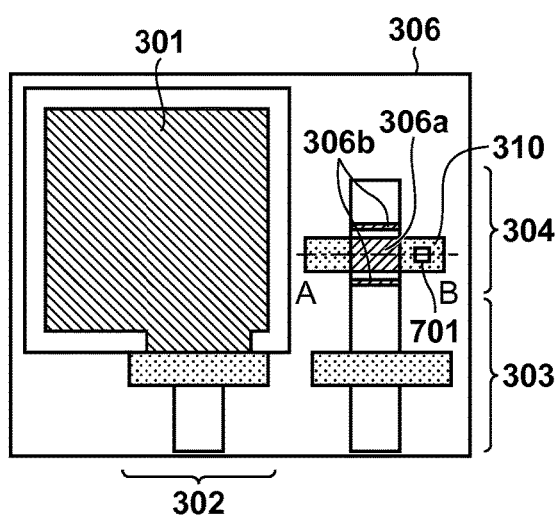

Next, the opening 306a formed above the channel of the third MOS transistor 304 according to the embodiment of the invention will further be explained with reference to FIGS. 1C and 1D. FIG. 1C shows an example of the planar layout view of the photoelectric converter 1610 in the pixel part 1611 formed in this embodiment. The photoelectric converter 1610 includes the photoelectric conversion element 301, first MOS transistor 302, second MOS transistor 303, and third MOS transistor 304. Also, the silicon nitride film 306 is so formed as to cover at least the photoelectric conversion element 301, first MOS transistor 302, second MOS transistor 303, and third MOS transistor 304. As described above, however, the opening 306a is formed in the insulating film 306 as a silicon nitride film above the gate electrode 310 of the third MOS transistor 304. As shown in FIG. 1C, the opening 306a is formed on a portion of the gate electrode corresponding to the channel region of the transistor, and formed independently of a contact hole 701 formed on the gate electrode 310. In addition, near the opening 306a, the openings 306b are formed in portions of the source/drain regions 311 via the side spacers 318 (not shown in FIG. 1C). The side spacers 318 are so arranged as to be surrounded by or sandwiched between the openings 306a and 306b.

Figure 1D:
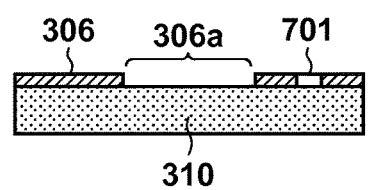

FIG. 1D is a schematic sectional view taken along a line A-B in FIG. 1C. FIG. 1D is a view for explaining the relation between the gate electrode 310, insulating film 306, and contact hole 701, and hence shows only these elements. As shown in FIG. 1D, in the insulating film 306 formed on the gate electrode 310, the opening 306a is formed in the portion corresponding to the channel region, and the contact hole 701 is also formed independently of the opening 306a. A contact plug is formed in the contact hole 701, and the insulating film 306 comes in contact with the contact plug through the contact hole 701 but does not come in contact with the contact plug through the opening 306a. As shown in FIG. 5B, although not shown in FIGS. 1C and 1D, the insulating film 306 also comes in contact with the contact plugs 325 formed on the source/drain regions 311 of the third MOS transistor 304.

Note that FIGS. 1C and 1D are views for mainly explaining the opening in the insulating film 306 of the third MOS transistor 304 in relation to the contact hole 701 formed on the gate electrode 310, so the shape of the insulating film 306 is merely an example. Therefore, the shape of the insulating film 306 is not limited to the shape shown in FIG. 1C.

In this embodiment described above, the opening 306a is formed in the insulating film 306 on the upper surface of the gate electrode 310 of the third MOS transistor 304 in the pixel part 1611. This makes it possible to promote hydrogen supply through the opening 306a in hydrogen sintering. That is, hydrogen supply is not interrupted in annealing such as hydrogen sintering, while the silicon nitride films such as the etching stopper film for contact etching and the antireflection film on the photoelectric conversion element are left behind. In particular, hydrogen is reliably supplied to the dangling bond in the interface of the gate insulating film of the MOS transistor, so a low-noise, solid-state image sensor can be manufactured. Note that in this embodiment, the case in which the present invention is applied to the amplification MOS transistor 304 has been explained. However, it is also possible to additionally form an opening in the insulating film 306 on the upper surface of the gate electrode of the transfer MOS transistor 302 or reset MOS transistor 303.

(Second Embodiment)

Figure 7A:
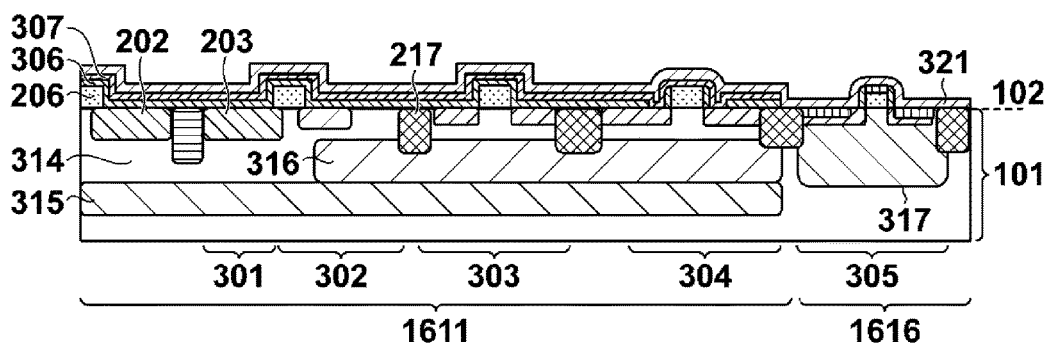
FIGS. 7A to 7C are views showing an example of a method of manufacturing a solid-state image sensor according to the second embodiment of the present invention.

A solid-state image sensor and a method of manufacturing the same according to the second embodiment of the invention will be explained below with reference to FIGS. 7A to 7C and 8A to 8C. This embodiment is directed to a structure having a waveguide on the upper surface of a photoelectric conversion element. First, a state shown in FIG. 7A is obtained by the same method as the manufacturing steps corresponding to FIGS. 2A to 4B explained in the first embodiment. This state shown in FIG. 7A is the same as that shown in FIG. 4B of the first embodiment. A pixel part 1611 includes n-type semiconductor regions 202 and 203 as charge storage regions. The pixel part 1611 also includes a first MOS transistor 302 and second MOS transistor 303 having gate electrodes covered with an insulating film 306 including a silicon nitride film, and a third MOS transistor 304 having an opening 306a of the silicon nitride film 306 in a portion of a gate electrode 310. Furthermore, a peripheral circuit part 1616 includes a MOS transistor 305 having side spacers formed by an insulating film including the same silicon nitride film as that of the insulating film 306.

In this structure, an insulating film 321 is so formed as to cover the regions of both the pixel part 1611 and peripheral circuit part 1616. The insulating film 321 is so formed as to include a silicon nitride film. Before this silicon nitride film is formed, however, it is also possible to form a silicon oxide film so as to cover both the pixel part 1611 and peripheral circuit part 1616. This further improves the adhesion by stress relaxation of the film.

Figure 7B:
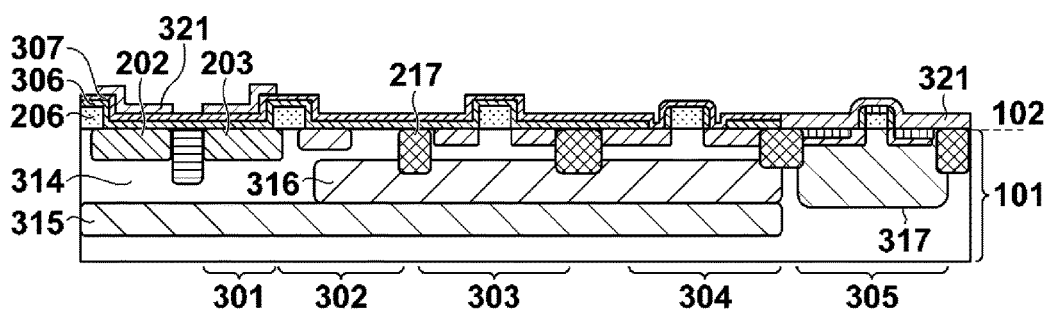

Then, in a step shown in FIG. 7B, the insulating film 321 formed in the pixel part 1611 and peripheral circuit part 1616 is patterned. In this step, if the silicon oxide film is formed together with the silicon nitride film, the silicon oxide film may also be patterned into the same shape as that of the silicon nitride film. Note that FIG. 4C also shows the state in which the insulating film 321 is similarly patterned. Unlike FIG. 4C, however, FIG. 7B shows the state in which the insulating film 321 keeps covering the n-type semiconductor regions 202 and 203 as the charge storage regions, that is, at least a portion of the photoelectric conversion element, and at least a portion of the gate electrode 207 of the first MOS transistor 302. The insulating film 321 is etched away from other regions of the pixel part 1611. Also, in the peripheral circuit part 1616, the insulating film 321 is not etched but left behind in the same manner as that shown in FIG. 4C.

Figure 7C:
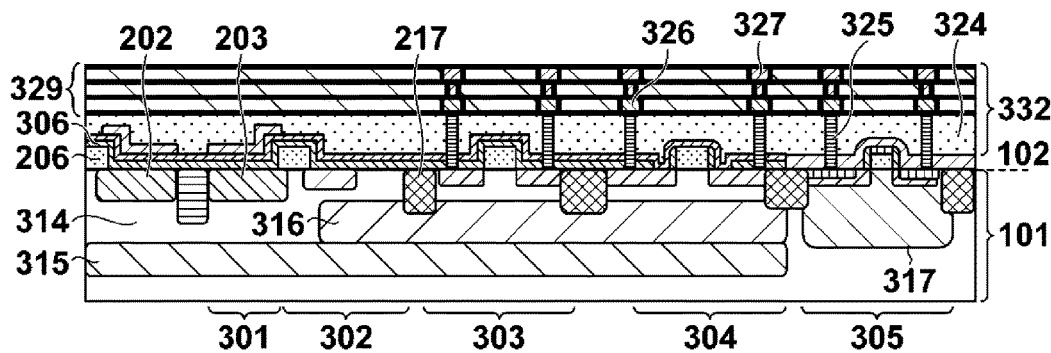

Subsequently, as shown in FIG. 7C, an interconnection layer 332 including an interlayer dielectric film 324, contact plugs 325, a plurality of interconnection layers 326 and 327, and a plurality of interlayer dielectric films 329 is formed by the same method as that explained in relation to FIGS. 5A to 5C in the first embodiment. Then, in a step shown in FIG. 8A, openings 323 are formed in the plurality of interlayer dielectric films of the interconnection layer 332. The openings 323 are formed by forming, on the plurality of interlayer dielectric films, a photoresist pattern having openings in regions corresponding to the photoelectric conversion elements (n-type semiconductor regions 202 and 203), and etching the plurality of interlayer dielectric films by using the photoresist pattern as a mask. This etching can be, for example, anisotropic etching. More specifically, plasma etching is performed on the plurality of interlayer dielectric films until the silicon nitride film of the insulating film 321 is exposed. This silicon nitride film of the insulating film 321 is a film for reducing plasma damage to the photoelectric conversion elements (n-type semiconductor regions 202 and 203) during etching, and also functions as an etching stopper film.

Figure 8A:
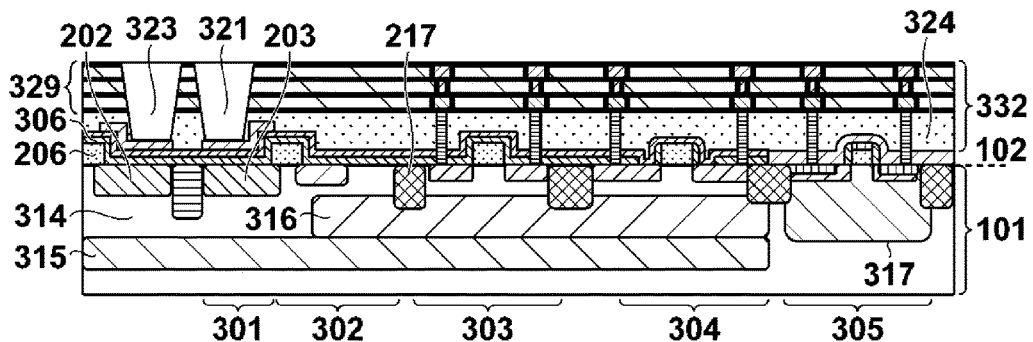
FIGS. 8A to 8C are views showing the example of the method of manufacturing the solid-state image sensor according to the second embodiment of the present invention.
Figure 8B:
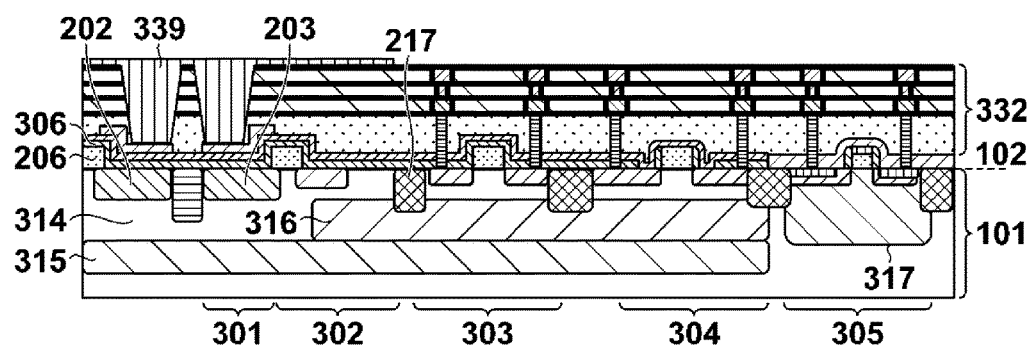

Then, in a step shown in FIG. 8B, a transparent material having a refractive index higher than that of the plurality of interlayer dielectric films serving as clads is filled in the openings 323, thereby forming portions as the cores of optical waveguides for guiding light to the photoelectric conversion elements. In this example, silicon nitride having a refractive index higher than that of silicon oxide is formed in the openings 323. More specifically, silicon nitride is deposited on the entire surface by high density plasma-CVD (to be referred to as HDP-CVD hereinafter), thereby filling the openings 323 with the silicon nitride. Consequently, a silicon nitride layer containing a large amount of hydrogen is formed, and hydrogen diffusion occurs during hydrogen sintering, so hydrogen is reliably supplied to the photoelectric conversion elements (n-type semiconductor regions 202 and 203). Note that the silicon nitride formed in portions other than the openings 323 can be removed by, for example, chemical mechanical polishing (to be referred to as CMP hereinafter) or plasma etching. In this step, it is possible planarize the surface of the silicon nitride and form a silicon nitride film 339.

In the example shown in FIG. 8B, the silicon nitride film 339 is removed from the peripheral circuit part 1616. Of the whole region of the peripheral circuit part 1616, however, the silicon nitride film 339 need only be removed from a region where a via plug 331 (to be described later) is to be formed. After that, an insulating film 330 is so formed as to cover the silicon nitride film 339. The insulating film 330 can be formed as, for example, a silicon oxide film. The insulating film 330 can be formed by, for example, plasma CVD. Then, the via plug 331 to be connected to an interconnection of an interconnection layer 332 is formed. The via plug 331 is made of, for example, tungsten, and can have a barrier metal such as titanium or titanium nitride. After that, a third interconnection layer 333 is formed above the via plug 331. The third interconnection layer 333 can be formed by a conductor mainly containing, for example, aluminum. The third interconnection layer 333 can also function as a light-shielding film of the peripheral circuit region.

Figure 8C:
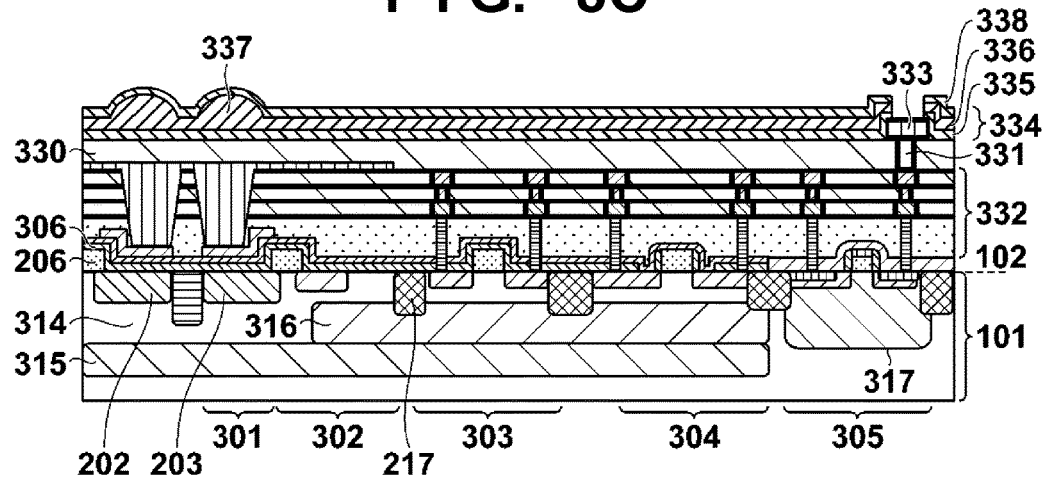

Subsequently, in a step shown in FIG. 8C, a first insulating layer 335 for forming an insulating film 334 and a second insulating layer 336 thicker than the first insulating layer 335 are formed in this order. Then, a photoresist pattern having a lens shape is formed on the second insulating layer 336, and the second insulating layer 336 is etched by using the photoresist pattern as a mask, thereby forming intra-layer lenses 337 in the second insulating layer. After that, a third insulating layer 338 is formed on the intra-layer lenses. The insulating film 334 is removed from those regions of the third interconnection layer 333, which correspond to pads such as an input pad and output pad. The second insulating layer 336 is a lens layer having the intra-layer lenses 337, and the first insulating layer 335 and third insulating layer 338 can function as antireflection layers of the second insulating layer 336. The intra-layer lenses 337 can be formed to increase the concentration of light, but is not essential in the present invention. Subsequently, a planarization layer (not shown) made of a resin, a color filter layer (not shown) including color filters corresponding to a plurality of colors, and a microlens layer (not shown) including microlenses are formed in this order.

As shown in FIGS. 1C and 1D, the opening 306a is formed in the insulating film 306 on the upper surface of the gate electrode 310 of the third MOS transistor 304 in the pixel part 1611 in this embodiment as well. Accordingly, it is possible to promote hydrogen supply through the opening 306a in hydrogen sintering. In addition, silicon nitride containing a large amount of hydrogen can be filled in the optical waveguide for guiding light to the photoelectric conversion element. This makes it possible to promote hydrogen supply to the photoelectric conversion element in hydrogen sintering. The above-described method can manufacture a solid-state image sensor having a good noise characteristic. That is, hydrogen supply is not interrupted in annealing such as hydrogen sintering, while silicon nitride films such as the etching stopper film for contact etching and the antireflection film on the photoelectric conversion element are left behind. Consequently, hydrogen is reliably supplied to the dangling bond in the interface of the gate insulating film of the MOS transistor and the photoelectric conversion element, so a low-noise, solid-state image sensor can be manufactured.

Note that as in the first embodiment, an opening may also be formed in the insulating film 306 on the upper surface of the gate electrode of the transfer MOS transistor 302 or reset MOS transistor 303 in this embodiment as well.

As an application example of the solid-state image sensor according to each of the above-mentioned embodiments, a camera incorporating the solid-state image sensor will be explained. The concept of the camera includes not only an apparatus whose main purpose is image capturing, but also an apparatus (for example, a personal computer or portable terminal) secondarily having an image capturing function. The camera includes the solid-state image sensor according to the present invention exemplified as the above-mentioned embodiment, and a processing unit for processing output signals from the solid-state image sensor. The processing unit can include, for example, an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-114367, filed Jun. 2, 2014, which is hereby incorporated by reference herein in its entirety.

What is claimed is:

1. A method of manufacturing a solid-state image sensor in which pixels are arranged, each of the pixels including a photoelectric conversion element and a first transistor, which is a MOS transistor, the method comprising:
    forming a first insulating film made of a nitrogen-containing silicon compound on the photoelectric conversion element and the first transistor;
    forming an opening in the first insulating film so that the opening is positioned above at least a portion of source/drain regions of the first transistor;
    forming a silicon oxide film to cover the opening in the first insulating film;
    forming a second insulating film on the first insulating film, after the forming of the opening and the forming of the silicon oxide film;
    depositing a metal on the silicon oxide film between the forming of the silicon oxide film and the forming of the second insulating film;
    etching the second insulating film and the first insulating film to form a contact hole extending through the second insulating film, the silicon oxide film, and the first insulating film; and
    forming, in the contact hole, a first contact plug in contact with the first insulating film and the second insulating film.

2. The method according to claim 1, wherein each of the pixels includes a second transistor, which is a MOS transistor, the first insulating film is arranged between the second transistor and the second insulating film, and the first contact plug is formed above the second transistor.

3. The method according to claim 1, further comprising, between the depositing and the forming of the second insulating film, forming a second silicon oxide film on the silicon oxide film.

4. The method according to claim 1, wherein in the forming of the opening, etching of the first insulating film formed on the first transistor is performed,
    wherein a side spacer is formed on a side surface of a gate electrode of the first transistor by the etching of the first insulating film in the forming of the opening, and
    wherein the opening to be formed above the first transistor is formed between the side spacer and a portion of the first insulating film.

5. The method according to claim 1, wherein each of the pixels includes a floating diffusion where an electric charge of the photoelectric conversion element is transferred, and the floating diffusion is connected to the first transistor.

6. The method according to claim 2, wherein the first insulating film is one of a silicon nitride film, a silicon oxynitride film, and a silicon carbonitride film, and
    wherein a second contact plug is arranged in contact with the first transistor, the second insulating film, and the silicon oxide film.

7. The method according to claim 1, further comprising forming a third insulating film containing a nitrogen-containing silicon compound over the second insulating film,
    wherein in the forming of the first insulating film, the first insulating film is formed by low-pressure chemical vapor deposition, and
    wherein in the forming of the third insulating film, the third insulating film is formed by plasma chemical vapor deposition.

8. The method according to claim 7, further comprising performing annealing for hydrogen diffusion, after the forming of the third insulating film.

9. The method according to claim 1, wherein the first transistor is an amplification MOS transistor configured to generate a signal based on electric charge generated by the photoelectric conversion element, and
    wherein an element isolation portion adjacent to the amplification MOS transistor is covered with the first insulating film in the forming of the second insulating film.

10. A solid-state image sensor in which pixels are arranged, comprising:
    a photoelectric conversion element, which is included in each of the pixels;
    a first MOS transistor, which is included in each of the pixels;
    a second MOS transistor, which is included in each of the pixels;
    a third MOS transistor, which is included in each of the pixels;
    a first insulating film, which is made of a nitrogen-containing silicon compound;
    a second insulating film, which covers the second MOS transistor and the third MOS transistor;
    a first contact plug connected to the second MOS transistor;
    a second contact plug connected to the third MOS transistor,
    wherein:
    the first insulating film continuously extends to cover the photoelectric conversion element, the first MOS transistor, the second MOS transistor, and an element isolation portion adjacent to the third MOS transistor,
    the first insulating film has an opening above the third MOS transistor,
    the second insulating film covers an upper face of the first insulating film and the opening of the first insulating film,
    the first contact plug is in contact with the first insulating film and the second insulating film, and
    the second contact plug is in contact with the second insulating film.

11. The sensor according to claim 10, wherein the opening is above at least a portion of a drain region of the third MOS transistor, the second contract plug is above the drain region of the third MOS transistor, and a side surface of the opening is spaced apart from the second contract plug.

12. The sensor according to claim 10, further comprising a side spacer made of a nitrogen-containing silicon compound, which is arranged on a side surface of a gate electrode of the third MOS transistor.

13. The sensor according to claim 10, wherein the first MOS transistor is a transfer transistor, which transfers an electric charge generated by the photoelectric conversion element, and wherein the third MOS transistor is an amplification MOS transistor, which generates a signal based on the electric charge generated by the photoelectric conversion element.

14. The sensor according to claim 10, further comprising:
    a silicon oxide film, which is arranged between the third MOS transistor and the second insulating film; and a side spacer made of a nitrogen-containing silicon compound, which is arranged between the silicon oxide film and a side surface of a gate electrode of the third MOS transistor, wherein the second contract plug is above a source region of the third MOS transistor, and a part of the opening is arranged between the gate electrode of the third MOS transistor and the second contract plug.

15. The sensor according to claim 10, further comprising a silicon oxide film, which is arranged between the first insulating film and the second insulating film, wherein the second contact plug is in contact with the silicon oxide film, and wherein the silicon oxide film covers a side surface of the opening.

16. The sensor according to claim 10, wherein the second contact plug is in contact with the first insulating film.

17. The sensor according to claim 10, further comprising:
a fourth MOS transistor having a silicide layer;
a third contact plug connected to the silicide layer; and
a silicon nitride film, which is arranged between the silicide layer and the second insulating film, wherein the third contact plug connected to the silicide layer is spaced apart from the first insulating film having the opening.

18. The sensor according to claim 10, further comprising:
a fourth MOS transistor arranged in a peripheral circuit part, which is other than a pixel part where the pixels are arranged; and a third contact plug connected to the fourth MOS transistor, wherein the third contact plug is in contact with the second insulating film and is spaced apart from the first insulating film having the opening.

19. The sensor according to claim 12, wherein the first insulating film covers an upper surface of the gate electrode of the third MOS transistor.

20. The sensor according to claim 10, further comprising an optical waveguide, which is arranged above the photoelectric conversion element, wherein the first insulating film is arranged between the optical waveguide and the photoelectric conversion element.

21. A camera comprising a solid-state image sensor as defined in claim 10 and a processor configured to process a signal output from the solid-state image sensor.

* * * * *